United States Patent
Wang et al.

(10) Patent No.: US 8,294,264 B2
(45) Date of Patent: Oct. 23, 2012

(54) RADIATE UNDER-BUMP METALLIZATION STRUCTURE FOR SEMICONDUCTOR DEVICES

(75) Inventors: Tzu-Yu Wang, Taipei (TW); Chi-Chun Hsieh, Tongluo Township (TW); An-Jhih Su, Bade (TW); Hsien-Wei Chen, Sinying (TW); Shin-Puu Jeng, Hsin-Chu (TW); Liwei Lin, Castro Valley, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 225 days.

(21) Appl. No.: 12/750,221

(22) Filed: Mar. 30, 2010

(65) Prior Publication Data

US 2011/0241201 A1    Oct. 6, 2011

(51) Int. Cl.
*H01L 23/48* (2006.01)
*H01L 23/52* (2006.01)

(52) U.S. Cl. .. 257/737; 257/773; 257/786; 257/E23.021

(58) Field of Classification Search .................. 257/737, 257/773, 786, E23.021
See application file for complete search history.

(56) References Cited

U.S. PATENT DOCUMENTS

| | | | | |
|---|---|---|---|---|
| 6,825,541 | B2* | 11/2004 | Huang et al. | 257/459 |
| 7,170,187 | B2* | 1/2007 | Bernier et al. | 257/784 |
| 7,812,462 | B2* | 10/2010 | Gee et al. | 257/786 |
| 2006/0278984 | A1* | 12/2006 | Yamada | 257/737 |
| 2010/0164096 | A1* | 7/2010 | Daubenspeck et al. | 257/737 |
| 2011/0049725 | A1* | 3/2011 | Topacio et al. | 257/773 |
| 2011/0108981 | A1* | 5/2011 | Rahim et al. | 257/737 |
| 2011/0175220 | A1* | 7/2011 | Kuo et al. | 257/737 |

* cited by examiner

*Primary Examiner* — Nitin Parekh
(74) *Attorney, Agent, or Firm* — Slater & Matsil, L.L.P.

(57) ABSTRACT

An under-bump metallization (UBM) structure for a semiconductor device is provided. The UBM structure has a center portion and extensions extending out from the center portion. The extensions may have any suitable shape, including a quadrangle, a triangle, a circle, a fan, a fan with extensions, or a modified quadrangle having a curved surface. Adjacent UBM structures may have the respective extensions aligned or rotated relative to each other. Flux may be applied to a portion of the extensions to allow an overlying conductive bump to adhere to a part of the extensions.

12 Claims, 10 Drawing Sheets

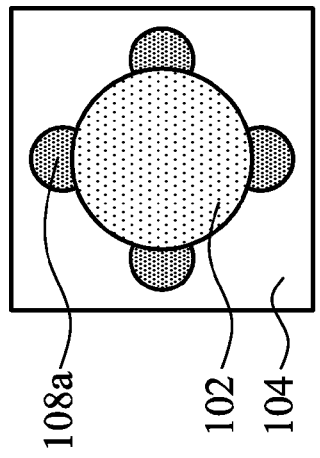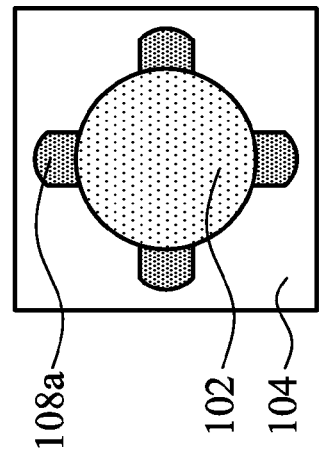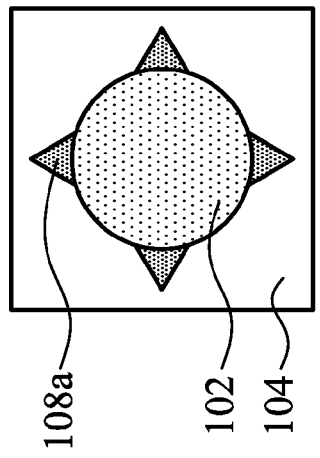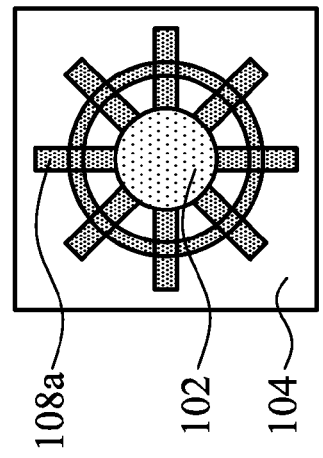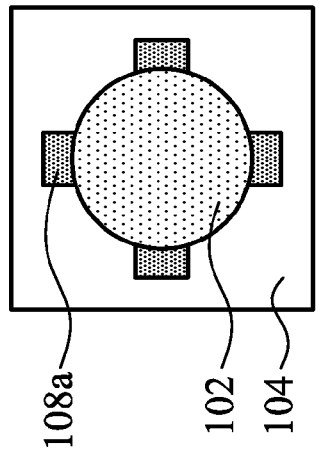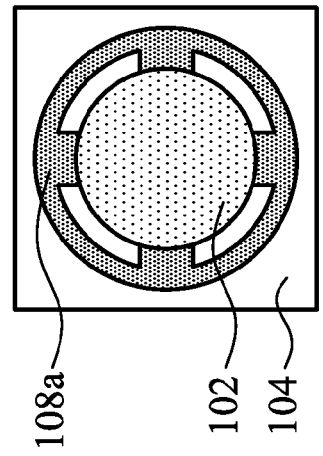

RADIATE UNDER-BUMP METALLIZATION STRUCTURE FOR SEMICONDUCTOR DEVICES

TECHNICAL FIELD

This disclosure relates generally to semiconductor devices and, more particularly, to under-bump metallization structures having extensions radiating outward from a center portion for semiconductor devices.

BACKGROUND

Since the invention of the integrated circuit (IC), the semiconductor industry has experienced continued rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

The past few decades have also seen many shifts in semiconductor packaging that have impacted the entire semiconductor industry. The introduction of surface-mount technology (SMT) and ball grid array (BGA) packages were generally important steps for high-throughput assembly of a wide variety of IC devices, while at the same time allowing for reduction of the pad pitch on the printed circuit board (PCB). Conventionally packaged ICs have a structure basically interconnected by fine gold wire between metal pads on the die and electrodes spreading out of molded resin packages. On the other hand, some chip scale packages (CSP) or BGA packages rely on bumps of solder to provide an electrical connection between contacts on the die and contacts on a substrate, such as a packaging substrate, a PCB, another die/wafer, or the like. In these cases, an under bump metal (UBM) layer is formed on a bond pad of the die, and a solder bump is placed on the UBM layer. The different layers making up this interconnection typically have different coefficients of thermal expansion (CTEs). As a result, a relatively large stress derived from this difference is exhibited on the joint area, which often causes cracks to form along the interface between the UBM layer and the solder bump.

In one attempt to reduce the stress between the solder bump and the UBM, the UBM was made larger. While this may reduce the stress in some devices, the increased size of the UBM caused the solder bump to become flat and deformed, thereby causing deformation issues and increasing the possibility of a bridging or shorting with adjacent solder bumps.

SUMMARY

An under-bump metallization (UBM) structure for a semiconductor device is provided. A substrate having one or more contact pads formed thereon is provided. A passivation layer is formed over the contact pads such that at least a portion of the contact pads is exposed. One or more UBM structures, each having a center portion and extensions extending away from the center portion, are formed such that each of the UBM structures is electrically coupled to respective ones of the contact pads. The extensions of adjacent UBM structures may be aligned or rotated relative to each other.

Other embodiments are disclosed.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 4a-4f are examples of various shapes a UBM may exhibit in accordance with various embodiments;

DETAILED DESCRIPTION

Figure 1A:
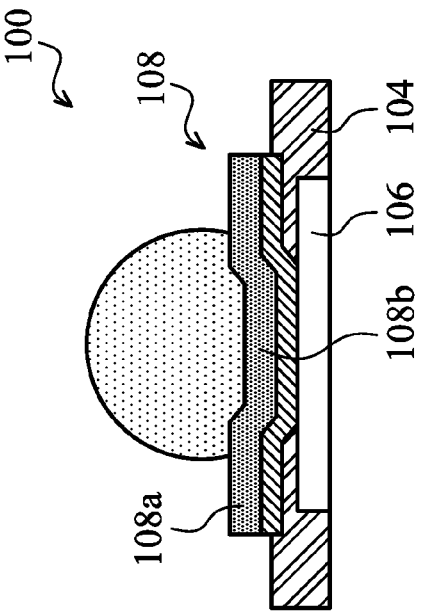
FIGS. 1a-1c are various views of a UBM and a conductive bump of a semiconductor device in accordance with an embodiment.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Embodiments described herein relate to the use of under-bump metallization (UBM) for use with semiconductor devices. As will be discussed below, embodiments are disclosed that utilize a UBM structure having structures radiating out from a center for the purpose of attaching one substrate to another substrate, wherein each substrate may be a die, wafer, printed circuit board, packaging substrate, or the like, thereby allowing for die-to-die, wafer-to-die, wafer-to-wafer, die or wafer to printed circuit board or packaging substrate, or the like. Throughout the various views and illustrative embodiments, like reference numerals are used to designate like elements.

Figure 1B:
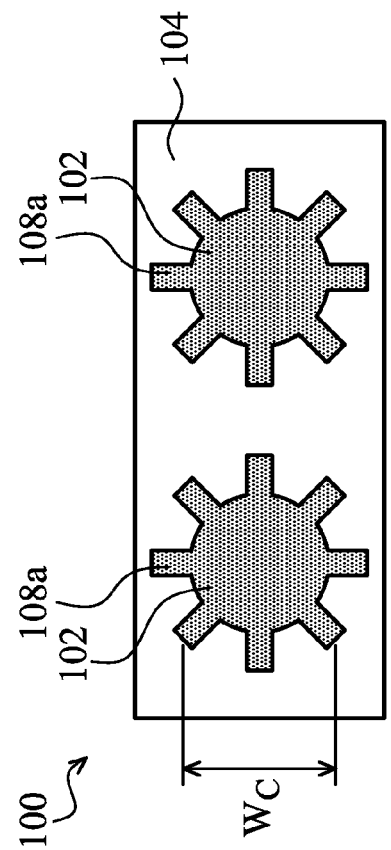
Figure 1C:
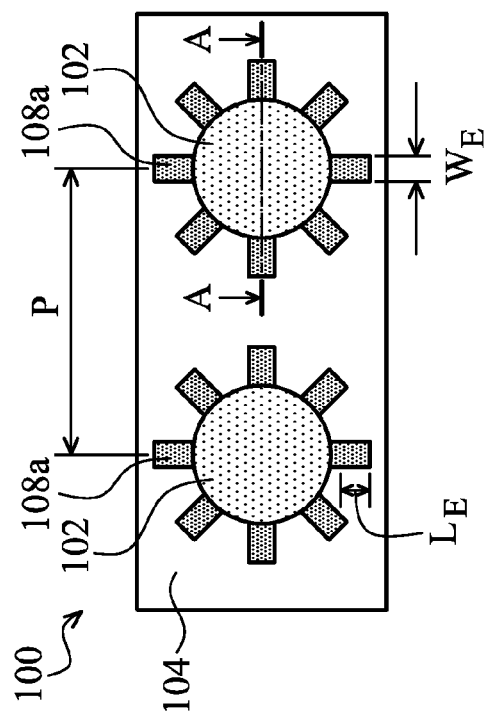

FIGS. 1a and 1b are a plan view and a side view, respectively, of a portion of a substrate 100 having conductive bumps 102 formed thereon in accordance with an embodiment, wherein FIG. 1b is taken along the A-A' line of FIG. 1a. Additionally, FIG. 1c is a plan view corresponding to FIG. 1a without the conductive bumps 102 formed thereon, wherein like reference numerals refer to like elements. Initially, it should be noted that the substrate 100 may be a portion of a die, a wafer, or the like. As one of ordinary skill in the art will appreciate, embodiments described herein may be used in any situation requiring an electrical connection to a contact pad.

The exterior surface of the substrate 100 is covered with a protective layer 104, such as a polymer layer, to protect the substrate 100 from environmental contaminants and to act as a stress buffer layer. Within the protective layer 104 are openings, which expose an underlying conductive pad 106. UBMs 108 having extensions 108a radiating outward from a center portion 108b are formed over the protective layer 104 in the openings, thereby providing an electrical connection with the underlying conductive pad 106. The center portion 108b is roughly the size of the desired conductive bump. The UBM 108 may be, for example, a copper or other conductive material. The conductive bumps 102, e.g., lead-free solder bumps, are formed on the UBM 108 and provide an electrical connection to a second substrate (not shown), such as a die, wafer, packaging substrate, or the like.

In an embodiment, a number of extensions 108a is at least 3 or greater, wherein a width $W_E$ of the extensions 108a is between about 0.19 and about 0.58 of a width $W_e$ of the center portion 108b, and a length $L_E$ of the extensions 108a is between about 0.11 and about 0.15 of a pitch P between adjacent UBMs 108. It has been found that these ratios are obtainable given the processing techniques discussed herein and simulation results indicate that these ratios may improve stress characteristics. It should be noted, however, that other embodiments may utilize different ratios.

Figure 2:
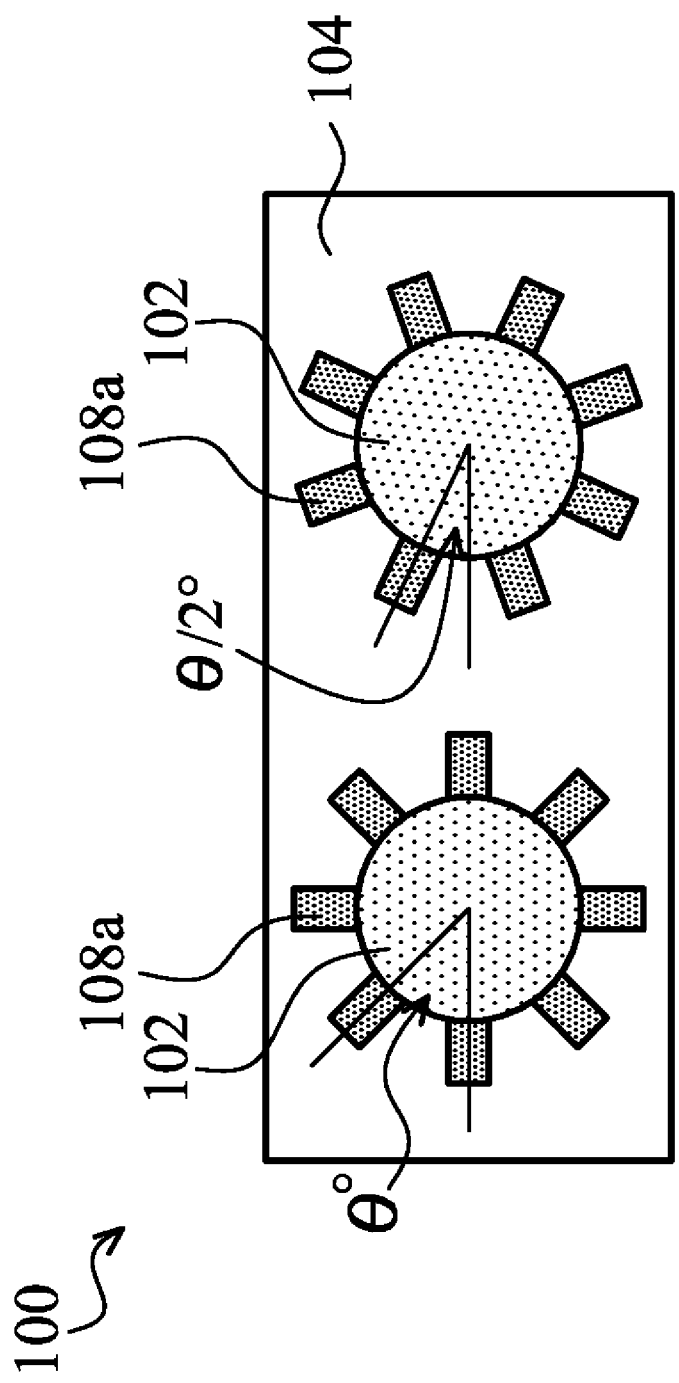
FIG. 2 is a plan view of an arrangement of UBMs in accordance with an embodiment.

FIG. 2 illustrates the UBMs 108 of FIGS. 1a-1c arranged in an interface pattern in accordance with an embodiment. As can be appreciated, the arrangement illustrated in FIGS. 1a-1c allows for a larger surface area for the UBM, thereby possibly decreasing the stress along the interface between the conductive bumps 102 and the UBMs 108. As sizes of the semiconductor devices decrease, however, an interface pattern such as that illustrated in FIG. 2 may be desirable. In this embodiment, the positioning of the extensions 108a of adjacent UBMs 108 are offset from each other. Such an interface pattern may reduce and/or eliminate bridging concerns between adjacent UBMs 108 by increasing the distance between the extensions 108a of the UBMs 108. In an embodiment, adjacent UBMs 108 are rotated θ/2 degrees, wherein θ is the angle between adjacent extensions 108a.

It is believed that embodiments such as those disclosed herein increase reliability of the semiconductor device by reducing and making uniform the stress between the conductive bumps 102 and the UBMs 108. In particular, it is believed that by extending the UBMs 108 past the expected boundary of the conductive bumps 102, the extensions reduce the stress concentrated at the interface of the UBMs 108 and conductive bumps 102.

Figure 3B:
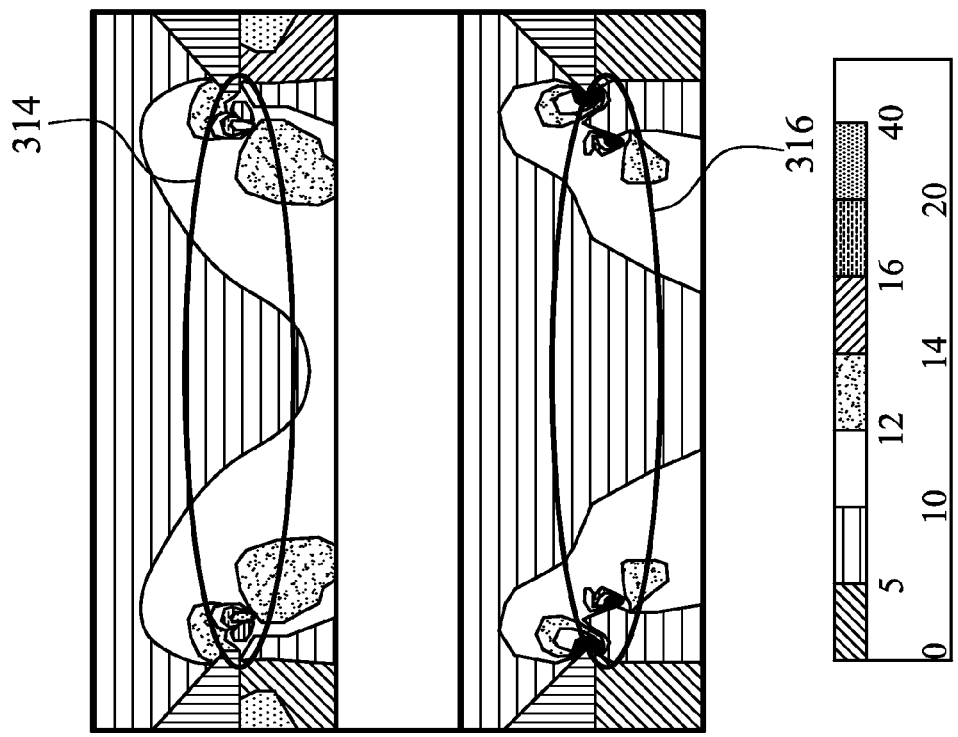
FIGS. 3a-3c illustrate differences in stress between a conductive bump and a UBM that may be obtained in accordance with an embodiment.
Figure 3A:
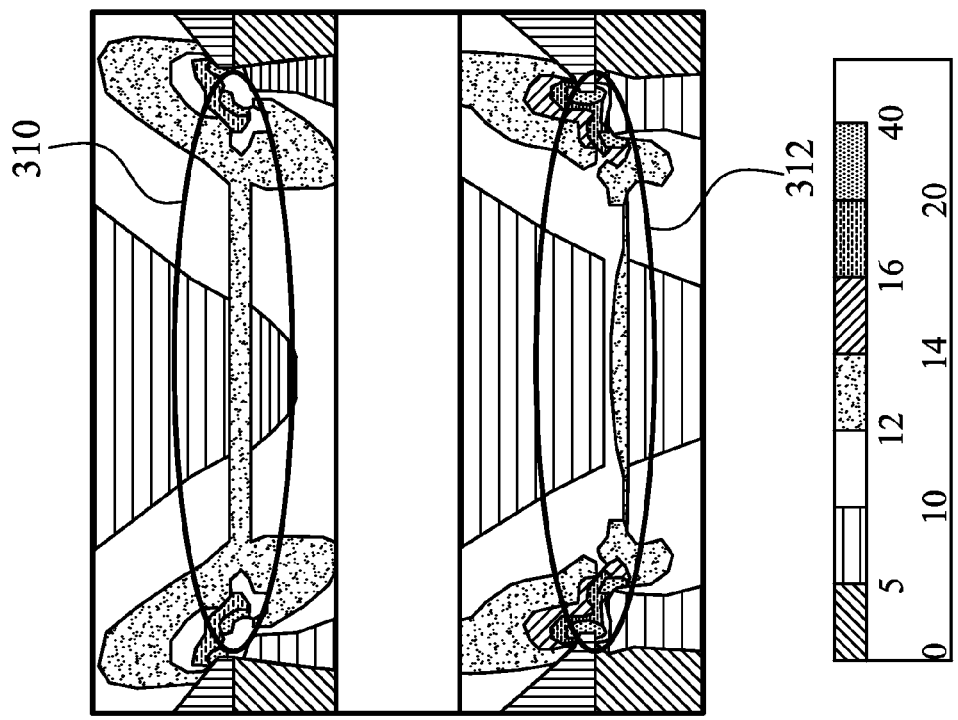
Figure 3C:
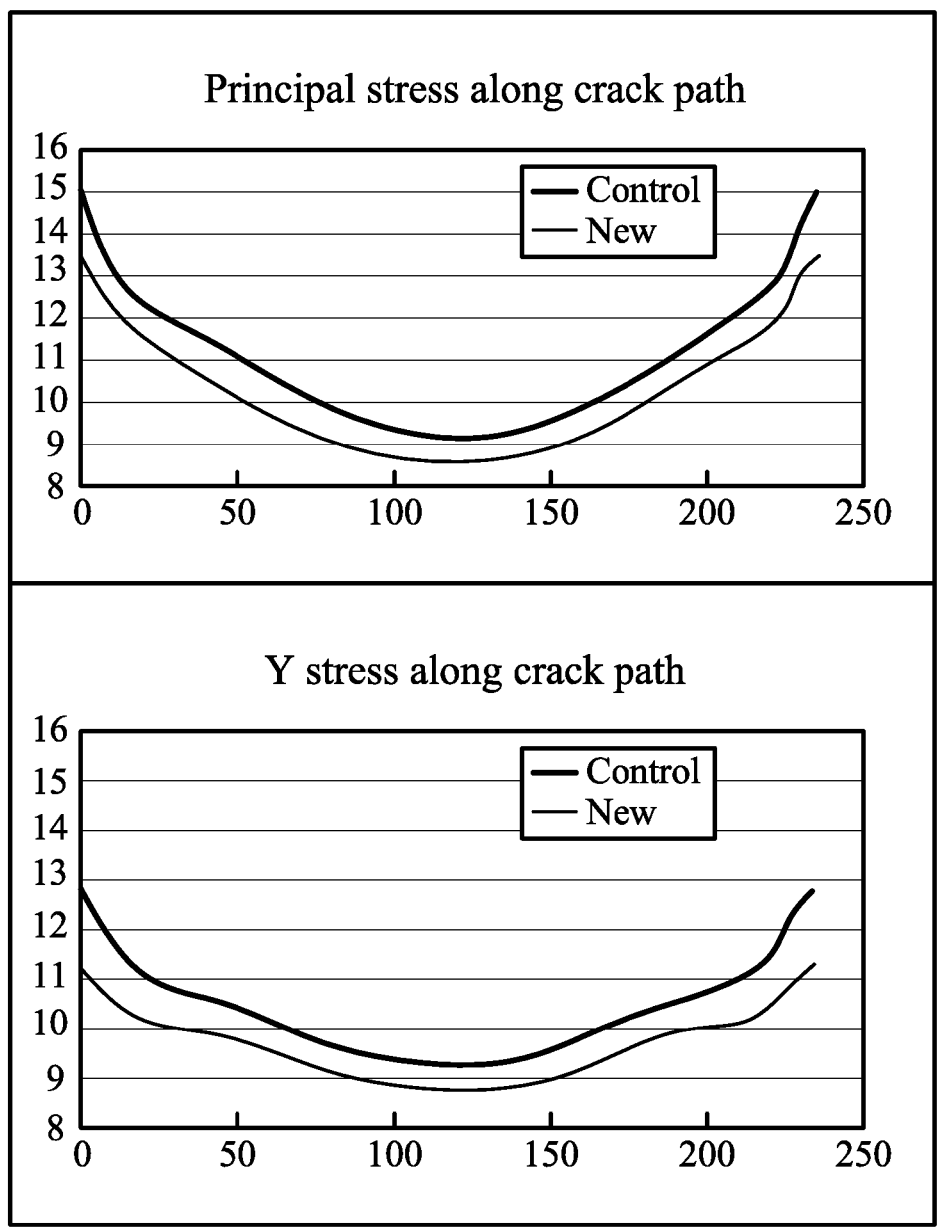

For example, FIGS. 3a and 3b are stress plots illustrating the principal stress and the Y stress, respectively, along the interface between the conductive bump and the UBM. For both FIGS. 3a and 3b, the top plots illustrate the stress seen in systems utilizing UBMs without extensions, and the bottom plots illustrate the stress that may be seen in embodiments utilizing UBMs with extensions such as those described herein. Referring first to FIG. 3a, one of ordinary skill in the art will appreciate that embodiments such as those described herein allow for a more uniform principal (e.g., crack) stress, particularly in the area identified by the ovals 310 and 312. With regard to FIG. 3b, a similar result can be seen in the Y (e.g., delamination) stress as indicated by the ovals 314 and 316. FIG. 3c illustrates that embodiments may reduce the principal stress and the Y stress by about 10%.

FIGS. 4a-4f illustrate various shapes the extensions 108a may have in accordance with various embodiments. In particular, FIGS. 4a-4f illustrate embodiments in which the extensions 108a have a shape corresponding to a quadrangle, a triangle, a circle, a fan, a fan with extensions, and a modified quadrangle having a curved surface, respectively. It should be noted that the embodiments illustrated in FIGS. 4a-4f show four extensions for illustrative purposes only, and accordingly, it should be noted that fewer or more extensions may be used in other embodiments.

Figure 5A:
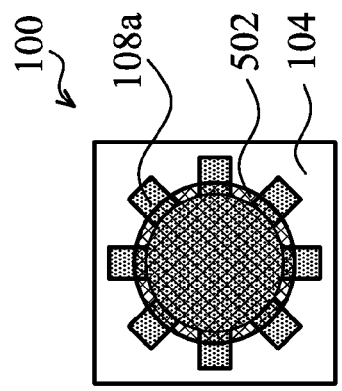
FIGS. 5a-5d are various views of a UBM with a flux applied thereto in accordance with an embodiment.
Figure 5B:
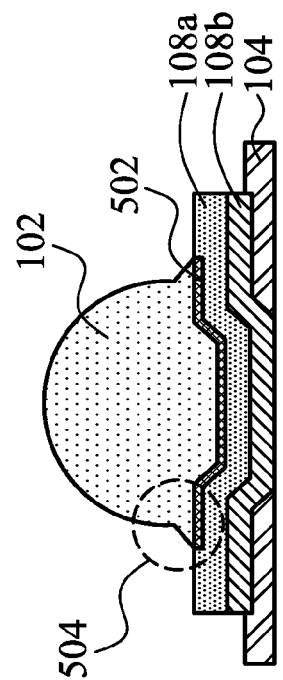
Figure 5C:
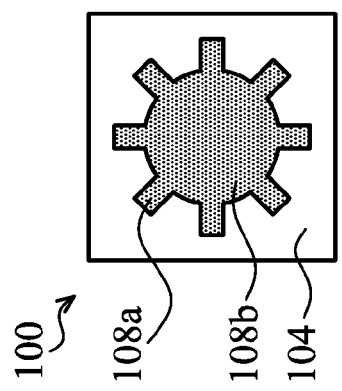
Figure 5D:
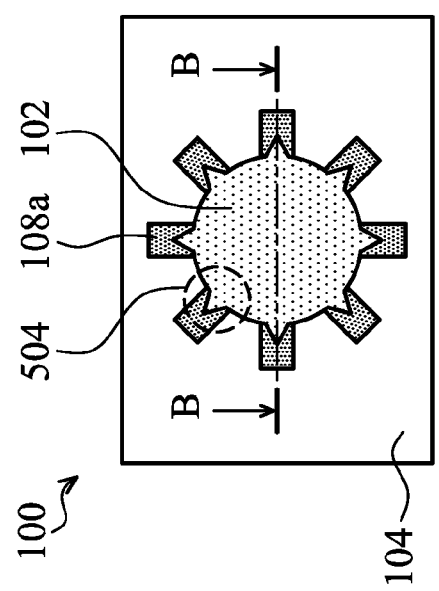

FIGS. 5a-5d illustrate the optional use of a flux 502 in accordance with an embodiment. For reference, FIG. 5a is a plan view of an embodiment such as that discussed above with reference to FIGS. 1a-1c, wherein like reference numerals refer to like elements. FIG. 5b is a plan view illustrating the use of a flux 502 patterned such that the flux extends out along a portion of the extensions 108a of the UBM 108 away from the center portion 108b of the UBM 108. As a result of using the flux 502 extending out along a portion of the extensions 108a, the conductive bumps 102 may tend to extend out along a portion of the extensions 108a as well, as illustrated in FIGS. 5c and 5d by the dashed circles 504, wherein FIG. 5d is a side view taken along the B-B' line illustrated in FIG. 5c. Such an embodiment may help reduce or eliminate the UBM undercut problem, as well as increase solder-UBM adhesive strength with footing controlled by flux area.

Figure 6:
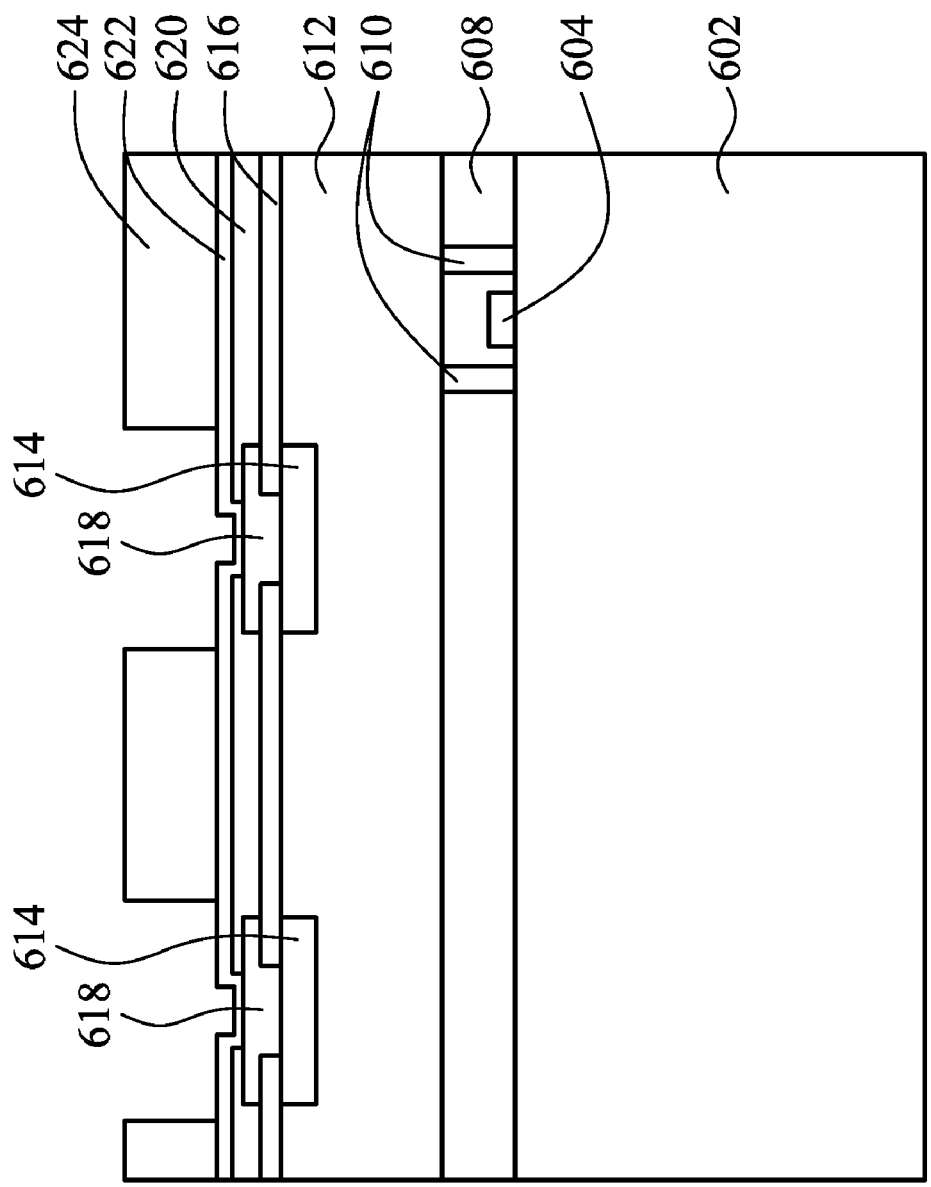
FIGS. 6-9 illustrate various intermediate stages of a method of forming a semiconductor device having an under-bump metallization structure in accordance with an embodiment.

FIGS. 6-9 illustrate various intermediate stages of a method of forming a semiconductor device such as that discussed above in accordance with an embodiment. Referring first to FIG. 6, a portion of a substrate 602 having electrical circuitry 604 formed thereon is shown in accordance with an embodiment. The substrate 602 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrates may also be used.

Electrical circuitry 604 formed on the substrate 602 may be any type of circuitry suitable for a particular application. In an embodiment, the electrical circuitry 604 includes electrical devices formed on the substrate 602 with one or more dielectric layers overlying the electrical devices. Metal layers may be formed between dielectric layers to route electrical signals between the electrical devices. Electrical devices may also be formed in one or more dielectric layers.

For example, the electrical circuitry 604 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application.

Also shown in FIG. 6 is an inter-layer dielectric (ILD) layer 608. The ILD layer 608 may be formed, for example, of a low-K dielectric material, such as phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method known in the art, such as spinning, chemical vapor deposition (CVD), and plasma-enhanced CVD (PECVD). It should also be noted that the ILD layer 608 may comprise a plurality of dielectric layers.

Contacts, such as contacts 610, are formed through the ILD layer 608 to provide an electrical contact to the electrical circuitry 604. The contacts 610 may be formed, for example, by using photolithography techniques to deposit and pattern a photoresist material on the ILD layer 608 to expose portions of the ILD layer 608 that are to become the contacts 610. An etch process, such as an anisotropic dry etch process, may be used to create openings in the ILD layer 608. The openings may be lined with a diffusion barrier layer and/or an adhesion layer (not shown), and filled with a conductive material. In an embodiment, the diffusion barrier layer comprises one or more layers of TaN, Ta, TiN, Ti, CoW, or the like, and the conductive material comprises copper, tungsten, aluminum, silver, combinations thereof, or the like, thereby forming the contacts 610 as illustrated in FIG. 6.

One or more inter-metal dielectric (IMD) layers 612 and the associated metallization layers (not shown) are formed over the ILD layer 608. Generally, the one or more IMD layers 612 and the associated metallization layers are used to interconnect the electrical circuitry 604 to each other and to provide an external electrical connection. The IMD layers 612 may be formed of a low-K dielectric material, such as FSG formed by PECVD techniques or high-density plasma CVD (HDPCVD), or the like, and may include intermediate etch stop layers. Conductive pads 614 are provided in the uppermost IMD layer to provide external electrical connections.

It should be noted that one or more etch stop layers (not shown) may be positioned between adjacent ones of the dielectric layers, e.g., the ILD layer 608 and the IMD layers 612. Generally, the etch stop layers provide a mechanism to stop an etching process when forming vias and/or contacts. The etch stop layers are formed of a dielectric material having a different etch selectivity from adjacent layers, e.g., the underlying semiconductor substrate 602, the overlying ILD layer 608, and the overlying IMD layers 612. In an embodiment, etch stop layers may be formed of SiN, SiCN, SiCO, CN, combinations thereof, or the like, deposited by CVD or PECVD techniques.

A protective layer 616 may be formed of a dielectric material, such as polyimide, polymer, an oxide, or the like, and patterned over the surface of the uppermost IMD layer 612 to provide an opening over the conductive pads 614 and to protect the underlying layers from various environmental contaminants. Thereafter, bond pads 618 are formed and patterned over the protective layer 616. The bond pads 618 provide an electrical connection upon which a UBM structure may be formed for external connections. The bond pads 618 may be formed of any suitable conductive material, such as copper, tungsten, aluminum, silver, combinations thereof, or the like.

One or more passivation layers, such as passivation layer 620, are formed and patterned over the conductive pads 618 as illustrated in FIG. 6. The passivation layer 620 may be formed of a dielectric material, such as polymer, by any suitable method, such as CVD, physical vapor deposition (PVD), or the like. In an embodiment, the passivation layer 620 has a thickness of about 1 μm to about 15 μm.

One of ordinary skill in the art will appreciate that a single layer of conductive/bond pads and a passivation layer are shown for illustrative purposes only. As such, other embodiments may include any number of conductive layers and/or passivation layers. Furthermore, it should be appreciated that one or more of the conductive layers may act as a redistribution layer (RDL) to provide the desired pin or ball layout.

FIG. 6 further illustrates a conformal seed layer 622 deposited over the surface of the passivation layer 620. The seed layer 622 is a thin layer of a conductive material that aids in the formation of a thicker layer during subsequent processing steps. In an embodiment, the seed layer 622 may be formed by depositing a thin conductive layer, such as a thin layer of Ti, Cu, Ta, TiN, TaN, combinations thereof, or the like, using CVD or PVD techniques.

Thereafter, as illustrated in FIG. 6, a patterned mask 624 is formed and patterned over the seed layer 622 in accordance with an embodiment. The patterned mask 624 defines the shape of the UBM. Accordingly, the patterned mask 624 is patterned to exhibit a shape having a center portion and extensions, such as one of the shapes discussed above. The patterned mask 624 may be a patterned photoresist mask, hard mask, a combination thereof, or the like.

Any suitable process may be used to form the structures discussed above and will not be discussed in greater detail herein. As one of ordinary skill in the art will realize, the above description provides a general description of the features of the embodiment and that numerous other features may be present. For example, other circuitry, liners, barrier layers, under-bump metallization configurations, and the like, may be present. The above description is meant only to provide a context for embodiments discussed herein and is not meant to limit the disclosure or the scope of any claims to those specific embodiments.

Figure 7:
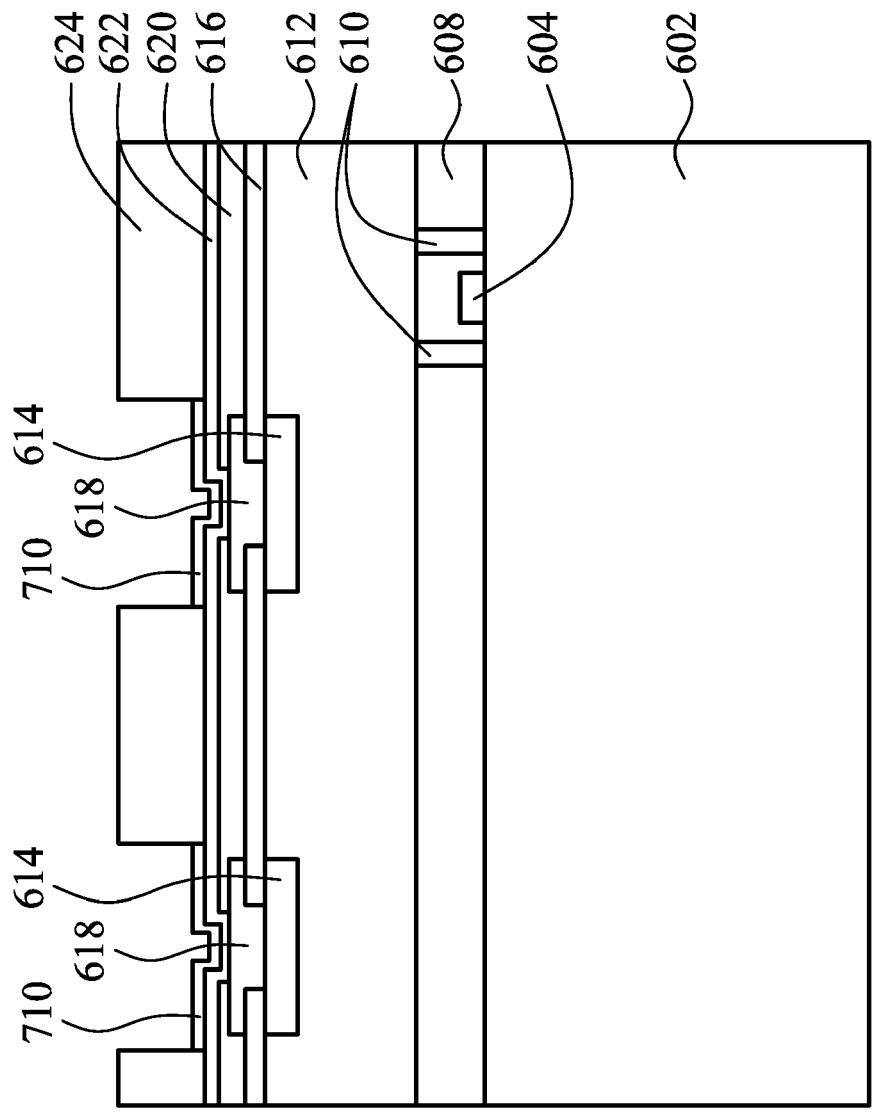

FIG. 7 illustrates the formation of UBMs 710 in accordance with an embodiment. The UBMs 710 may be formed of any suitable conductive material, including Cu, Ni, Pt, Al, combinations thereof, or the like, and may be formed through any number of suitable techniques, including PVD, CVD, electrochemical deposition (ECD), molecular beam epitaxy (MBE), atomic layer deposition (ALD), electroplating, and the like. It should be noted that in some embodiments, such as those that deposit a conformal layer over the entire surface of the wafer (e.g., PVD and CVD), it may be desirable to perform an etching or planarization process (e.g., a chemical mechanical polishing (CMP)) to remove excess conductive material from the surface of the patterned mask 624. In an embodiment, the UBM 710 has a thickness between about 1 μm and about 10 μm.

Figure 8:
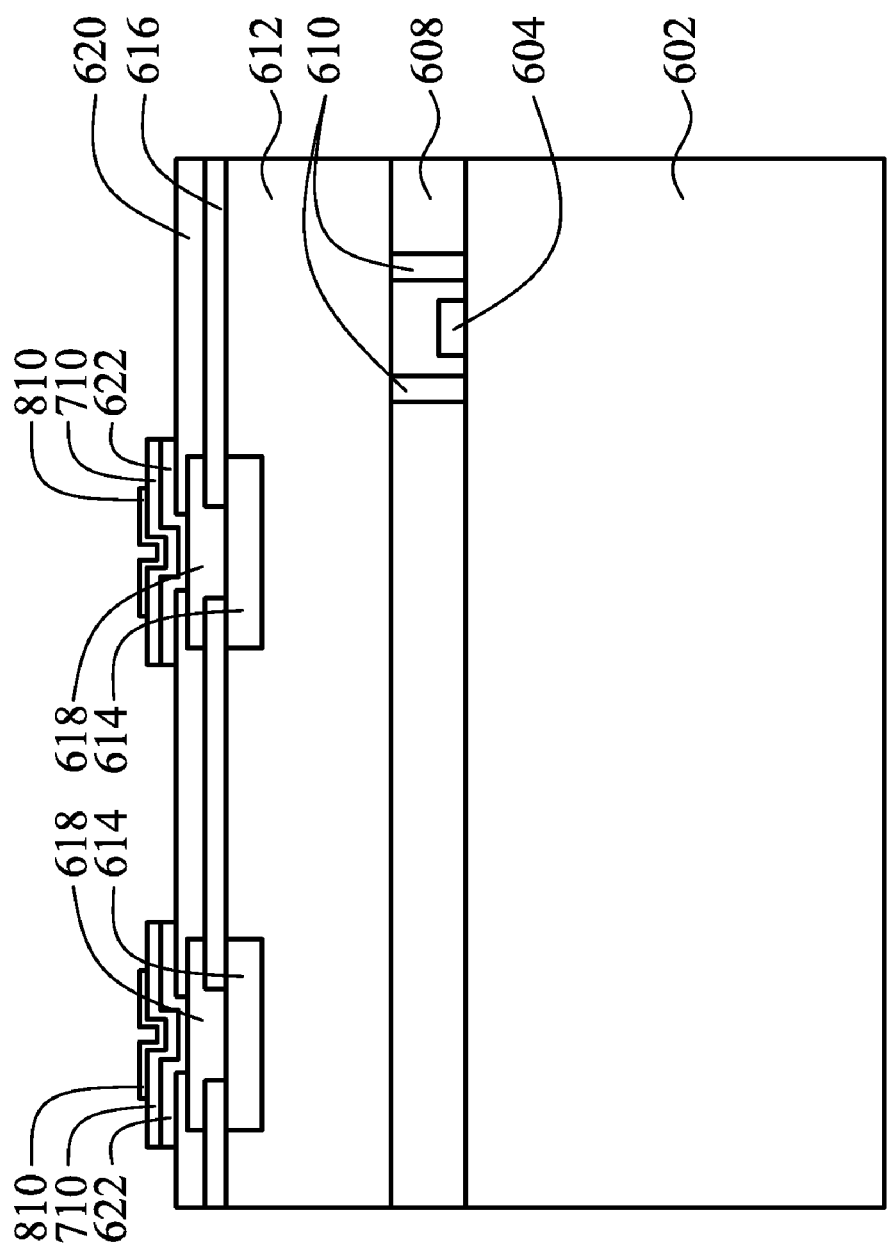

FIG. 8 illustrates removal of the patterned mask 624 (corresponding to the shape of the UBM 710) and an optional formation of a patterned flux 810 in accordance with an embodiment. In embodiments in which the patterned mask 624 is formed from photoresist materials, the photoresist may be stripped by, for example, a chemical solution such as a mixture of ethyl lactate, anisole, methyl butyl acetate, amyl acetate, cresol novolak resin, and diazo photoactive compound (referred to as SPR9), or another stripping process. A cleaning process, such as a wet dip in a chemical solution of phosphoric acid ($H_3PO_4$) and hydrogen peroxide ($H_2O_2$), referred to as DPP, with 2% hydrofluoric (HF) acid, or another cleaning process, may be performed to remove exposed portions of the seed layer 622 and any contaminants from the surface of the passivation layer 620.

As discussed above with reference to FIGS. 5a-5d, it may be desirable to apply a patterned flux, such as the patterned flux 810, to better allow the conductive bump material formed in subsequent processing steps to extend out over a portion of the extensions 108a (see, e.g., FIGS. 5a-5d). The patterned flux 810 may be formed using any suitable technique, such as using stenciling techniques that utilize a pattern (e.g., a stencil) to control where the flux is applied.

Figure 9:
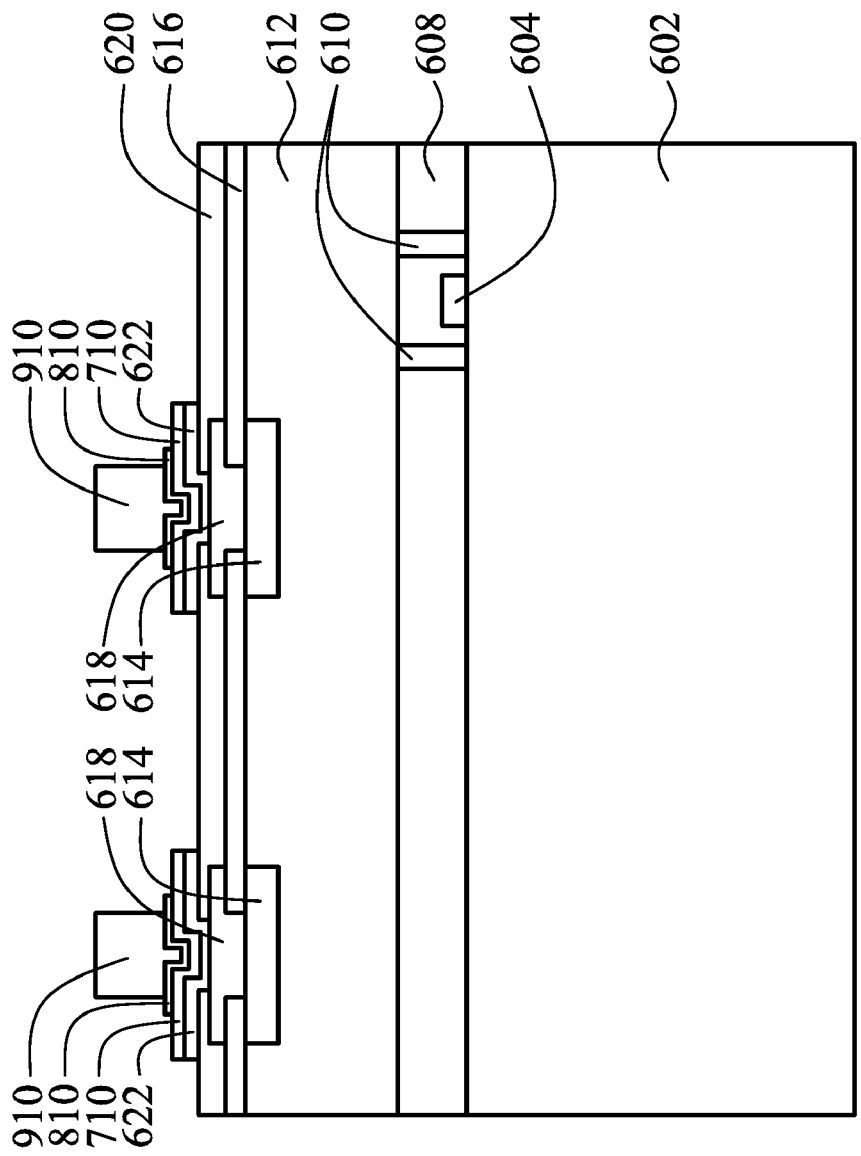

FIG. 9 illustrates formation of conductive bumps 910. In an embodiment, the conductive bumps 910 comprise SnPb, a high-Pb material, a Sn-based solder, a lead-free solder, or other suitable conductive material. The conductive bumps may be formed by any suitable process, such as a pick-and-place procedure, use of a patterned mask and deposition techniques, or the like.

Thereafter, a solder reflow process and other back-end-of-line (BEOL) processing techniques suitable for the particular application may be performed. During the reflow process, particularly if the patterned flux is used as discussed above, the conductive bumps 910 may extend out along portions of the extensions. The other BEOL processing techniques may include, for example, an encapsulant being formed, a singulation process being performed to singulate individual dies, wafer-level or die-level stacking, and the like, being performed. It should be noted, however, that embodiments may be used in many different situations. For example, embodiments may be used in a die-to-die bonding configuration, a die-to-wafer bonding configuration, a wafer-to-wafer bonding configuration, die-level packaging, wafer-level packaging, or the like.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor structure comprising:
a substrate comprising a first bond pad;
a passivation layer overlying the substrate and at least a portion of the first bond pad;
a first under bump metal (UBM) layer disposed over the first bond pad and extending through the passivation layer to the first bond pad, the first UBM layer having a center portion and extensions extending from the center portion over a top surface of the passivation layer; and
a conductive bump over the center portion of the UBM layer such that at least a portion of the extensions protrude from an edge of the conductive bump.

2. The semiconductor structure of claim 1, wherein the conductive bump extends out over at least a portion of the extensions.

3. The semiconductor structure of claim 1, wherein the substrate further comprises a second bond pad and further comprising a second UBM layer disposed over the second bond pad and extending through the passivation layer to the second bond pad, the second UBM layer having a center portion and extensions extending from the center portion over the top surface of the passivation layer.

4. The semiconductor structure of claim 3, wherein the first bond pad and the second bond pad are adjacent bond pads, and wherein the extensions of the first UBM layer are rotated relative to the extensions of the second UBM layer.

5. The semiconductor structure of claim 3, wherein the first bond pad and the second bond pad are adjacent bond pads, and wherein the extensions of the first UBM layer are aligned with the extensions of the second UBM layer.

6. The semiconductor structure of claim 1, wherein the extensions have a shape of a quadrangle, a triangle, a circle, a fan, a fan with extensions, or a modified quadrangle having a curved surface.

7. A semiconductor structure comprising:
a substrate having a plurality of bond pads;
a passivation layer over the substrate, the passivation layer having an opening over each of the plurality of bond pads; and
a plurality of under bump metal (UBM) structures, each of the plurality of UBM structures being over a corresponding one of the openings, each of the plurality of UBM structures having a center portion and a plurality of extensions protruding from the center portion, the plurality of extensions being over the passivation layer.

8. The semiconductor structure of claim 7, further comprising a conductive bump over the center portion of the UBM structures such that at least a portion of the extensions protrude from an edge of the conductive bump.

9. The semiconductor structure of claim 8, wherein the conductive bump extends out over at least a portion of the extensions.

10. The semiconductor structure of claim 7, wherein the extensions of adjacent UBM structures are rotated relative to each other.

11. The semiconductor structure of claim 7, wherein the extensions of adjacent UBM structures are aligned with each other.

12. The semiconductor structure of claim 7, wherein the extensions have a shape of a quadrangle, a triangle, a circle, a fan, a fan with extensions, or a modified quadrangle having a curved surface.

* * * * *